(12) United States Patent
Hanaoka

(10) Patent No.: US 7,462,937 B2
(45) Date of Patent: Dec. 9, 2008

(54) SEMICONDUCTOR DEVICE

(75) Inventor: Terunao Hanaoka, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/396,963

(22) Filed: Apr. 3, 2006

(65) Prior Publication Data

US 2006/0220247 A1    Oct. 5, 2006

(30) Foreign Application Priority Data

Apr. 4, 2005  (JP)  ............................. 2005-107315

(51) Int. Cl.
*H01L 23/48*  (2006.01)
(52) U.S. Cl. .................. 257/737; 257/738; 257/774; 257/781; 257/E23.151
(58) Field of Classification Search ............. 257/738, 257/780, 781, E23.151, 737, 773–775
See application file for complete search history.

(56) References Cited

U.S. PATENT DOCUMENTS

| | | | |
|---|---|---|---|
| 6,313,532 B1 * | 11/2001 | Shimoishizaka et al. | .... 257/734 |
| 6,441,487 B2 * | 8/2002 | Elenius et al. | .............. 257/738 |
| 6,617,674 B2 * | 9/2003 | Becker et al. | ................ 257/678 |
| 6,707,153 B2 | 3/2004 | Kuwabara et al. | |
| 6,940,160 B1 | 9/2005 | Hanaoka et al. | |
| 6,946,723 B2 * | 9/2005 | Satoh et al. | .................. 257/669 |
| 6,998,718 B2 * | 2/2006 | Chang et al. | ................. 257/781 |
| 7,002,250 B2 * | 2/2006 | Hozoji et al. | ................ 257/730 |
| 7,057,283 B2 * | 6/2006 | Inoue et al. | .................. 257/737 |
| 2004/0094841 A1 | 5/2004 | Matsuzaki et al. | |
| 2004/0227239 A1 * | 11/2004 | Murata et al. | ................ 257/738 |
| 2004/0245630 A1 * | 12/2004 | Huang et al. | ................. 257/737 |

FOREIGN PATENT DOCUMENTS

| | | |
|---|---|---|
| JP | 2001-144223 | 5/2001 |
| JP | 2003-229450 | 8/2003 |
| JP | 2004-349610 | 12/2004 |
| WO | WO00/55898 | 9/2000 |
| WO | WO01/71805 | 9/2001 |

* cited by examiner

*Primary Examiner*—Tuan N. Quach
(74) *Attorney, Agent, or Firm*—Harness, Dickey & Pierce, P.L.C.

(57) ABSTRACT

A semiconductor device includes: a semiconductor substrate; an insulation layer which is disposed on the semiconductor substrate and includes a groove formed on a second surface of the insulation layer, opposite from a first surface of the insulation layer facing the semiconductor substrate; and a conductive part disposed on the insulation layer; wherein the conductive part has a wiring part formed in a manner that the wiring part comes in contact with a bottom surface and a side surface of the groove.

8 Claims, 9 Drawing Sheets

(A)

(B)

(A)

(B)

(C)

(D)

(E)

(A)

(B)

(C)

(A)

(B)

(C)

(D)

(A)

(B)

(C)

(A)

(B)

(A)

(B)

(A)

(B)

SEMICONDUCTOR DEVICE

The entire disclosure of Japanese Patent Application No. 2005-107315, filed Apr. 4, 2005 is expressly incorporated by reference herein.

BACKGROUND

1. Technical Field

The present invention relates to a semiconductor device and a manufacturing method of the same.

2. Related Art

A semiconductor device having wires on the insulation layer is known. Miniaturization of the wires leads to downsizing of the contact area between the wires and the insulation layer, and adhesiveness between them tends to weaken. In order to increase reliability of the semiconductor device, it is important to prevent the wires from peeling off.

JP-A-2001-144223 is an example of related art.

SUMMARY OF THE INVENTION

An advantage of the invention is to provide a highly reliable semiconductor device and a method for manufacturing the same.

According to a first aspect of the invention, a semiconductor device includes: a semiconductor substrate; an insulation layer which is disposed on the semiconductor substrate and includes a groove formed on a second surface of the insulation layer, opposite from a first surface of the insulation layer facing the semiconductor substrate; and a conductive part disposed on the insulation layer; wherein the conductive part has a wiring part formed in a manner that the wiring part is in contact with a bottom surface and a side surface of the groove. In this case, the wiring part is formed so as to come in contact with the bottom and side surfaces of the groove. Consequently, the contact area between the wiring part and the groove may widen. Thus, adhesiveness between the wiring part and the groove may increase. According to the first aspect of the invention, it is thus possible to provide a highly reliable semiconductor device, with which the peeling off of the wiring part does not readily occur even when the wires are miniaturized.

With the semiconductor device, the wiring part may be formed only inside the groove.

The semiconductor device may further include an insulation film formed along the groove and over the wiring part.

With the semiconductor device, the conductive part may include an electrical connection part electrically connected to the wiring part.

With the semiconductor device, the electrical connection part may be formed on the second surface of the insulation layer.

With the semiconductor device, a recessed part communicating with the groove may be formed in the insulation layer and that the electrical connection part may be formed inside the recessed part.

The semiconductor device may further include an external terminal formed on the electrical connection part.

The semiconductor device may further include: a second insulation layer which is disposed on the insulation layer and includes a second groove formed on a surface of the insulation layer, opposite from a surface of the insulation layer facing the insulation layer; and a second conductive part disposed on the second insulation layer; wherein the second conductive part includes a second wiring part formed in a manner that the second wiring part is in contact with a bottom surface and a side surface of the second groove.

With the semiconductor device, a through hole may be formed in the insulation layer and that the groove may be communicating with the through hole.

According to a second aspect of the invention, a method for manufacturing a semiconductor device includes: forming an insulation layer on a semiconductor substrate so as to include a groove on a second surface of the insulation layer, opposite from a first surface of the insulation layer facing the semiconductor substrate; and forming, on the insulation layer, a conductive part having a wiring part in a manner that the wiring part comes in contact with a bottom surface and a side surface of the groove. According to the second aspect of the invention, it is possible to manufacture a highly reliable semiconductor device, with which the peeling off of the wiring part does not readily occur.

With the semiconductor device manufacturing method, it is preferable that the wiring part is formed only inside the groove.

The semiconductor device manufacturing method may further include forming an insulation film along the groove and over the wiring part.

With the semiconductor device manufacturing method, it is preferable that the formation of the insulation film includes disposing insulation paste over the wiring part and curing the insulation paste. Accordingly, the semiconductor device may be efficiently manufactured.

With the semiconductor device manufacturing method, the insulation paste may be disposed by being ejected from a nozzle.

With the semiconductor device manufacturing method, the conductive part may be formed so as to include an electrical connection part electrically connected to the wiring part.

With the semiconductor device manufacturing method, the electrical connection part may be formed on the second surface of the insulation layer.

With the semiconductor device manufacturing method, the insulation layer may be formed so as to include a recessed part communicating with the groove, and the electrical connection part may be formed inside the recessed part.

The semiconductor device manufacturing method may further include forming an external terminal on the electrical connection part.

The semiconductor device manufacturing method may further include: forming a second insulation layer on the insulation layer so as to include a second groove formed on a surface of the second insulation layer, opposite from another surface of the second insulation layer facing the insulation layer; and forming, on the second insulation layer, a second conductive part having a second wiring part in a manner that the second wiring part comes in contact with a bottom surface and a side surface of the second groove.

With the semiconductor device manufacturing method, the insulation layer may be formed in a manner that the insulation layer includes a through hole and that the groove communicates with the through hole.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
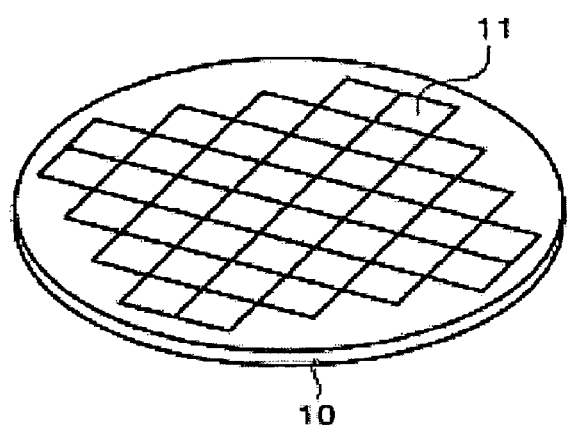
FIGS. 1A and 1B are diagrams to explain a method for manufacturing a semiconductor device according to a first embodiment applying the invention.
Figure 1:
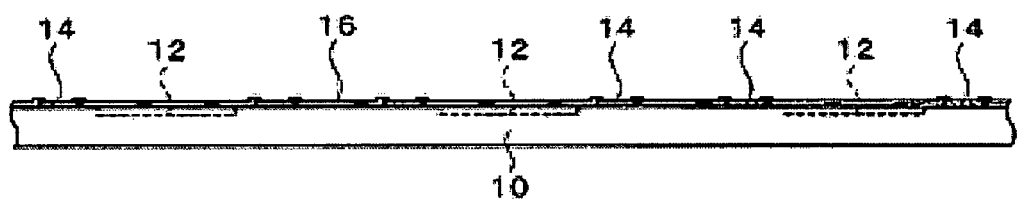
Figure 2:
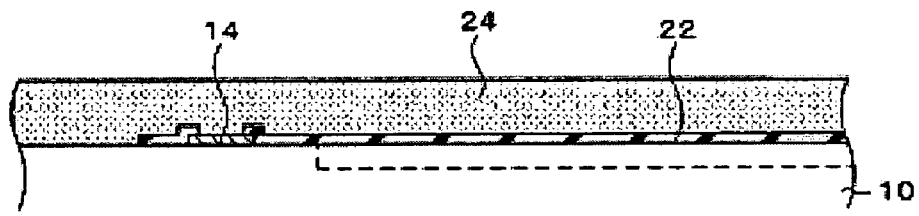
FIGS. 2A through 2E are diagrams to explain the semiconductor device manufacturing method according to the first embodiment applying the invention.
Figure 2:
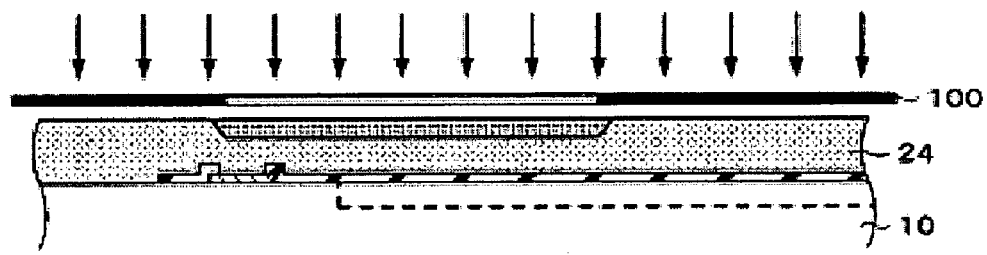
Figure 2:
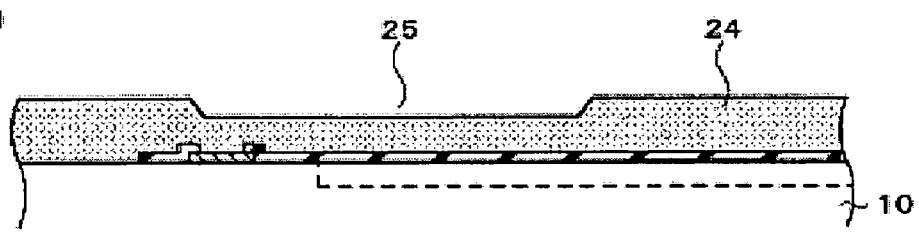
Figure 2:
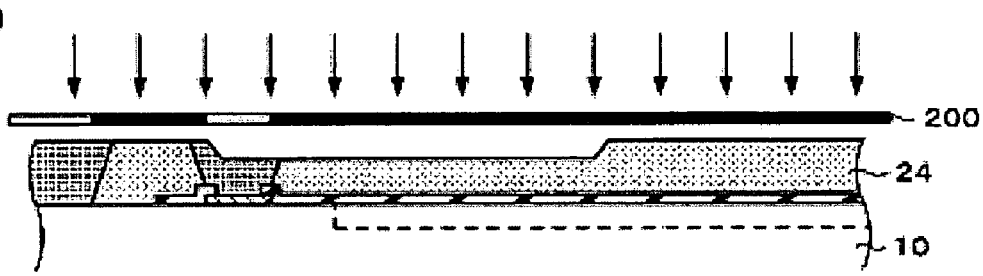
Figure 2:
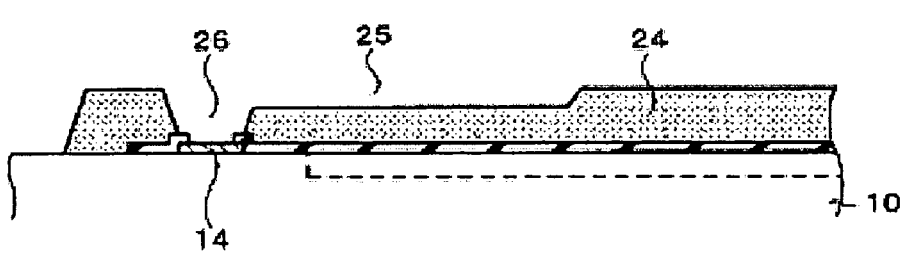

Embodiments of the invention will now be described. The present invention, however, is not limited to the following embodiments. Further, the invention includes combinations of the following embodiments and their modified examples.

First Embodiment

The semiconductor device manufacturing method in accordance with the first embodiment applying the invention will now be described. FIGS. 1A through 7 are diagrams to explain the semiconductor device manufacturing method according to the first embodiment applying the invention.

The semiconductor device manufacturing method according to the present embodiment may include preparing a semiconductor substrate 10 as shown in FIGS. 1A and 1B. FIG. 1A is a perspective diagram of the semiconductor substrate 10, and FIG. 1B is a cross-sectional, partially enlarged diagram of the semiconductor substrate 10. The semiconductor substrate 10 may be a silicon substrate, for example. The semiconductor substrate 10 may be in a form of a wafer (see FIG. 1A). The wafer-like semiconductor substrate 10 may contain regions 11 that become a plurality of semiconductor devices. The semiconductor substrate 10 may be in a form of chips. The semiconductor substrate 10 may contain one or more integrated circuits 12 (one on the semiconductor chip, and more than one on the semiconductor wafer). The integrated circuit 12 may be formed in every region 11. The composition of the integrated circuit 12 is not limited to a particular composition but may include, for example, active elements such as transistors and passive elements such as resistors, coils, and condensers. Also, the semiconductor substrate 10 includes a plurality of electrodes 14. The electrodes 14 may be electrically connected to the internal part of the semiconductor substrate 10. The electrodes 14 may be electrically connected to the integrated circuits 12. Electrodes that are not electrically connected to the integrated circuits 12 may also be referred to as the electrodes 14. The electrodes 14 may be made of metal such as aluminum or copper. The electrodes 14 may be aligned along the periphery of each region 11. Alternatively, the electrodes 14 may be arranged in area array per each region 11. Further, the electrodes 14 may be formed so as to overlap the integrated circuits 12, or, alternatively, the electrodes 14 may be formed so as not to overlap the integrated circuits 12. Further, the semiconductor substrate 10 may include a passivation film 16. The passivation film 16 may have apertures to expose each of the electrodes 14 (at the middle part of each electrode 14, for example). The passivation film may be made of $SiO_2$, SiN, or polyimide resin, for example.

Figure 3:
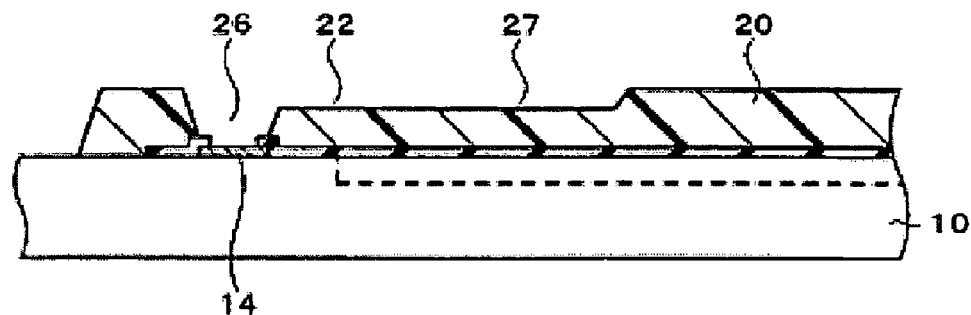
FIGS. 3A through 3C are diagrams to explain the semiconductor device manufacturing method according to the first embodiment applying the invention.
Figure 3:
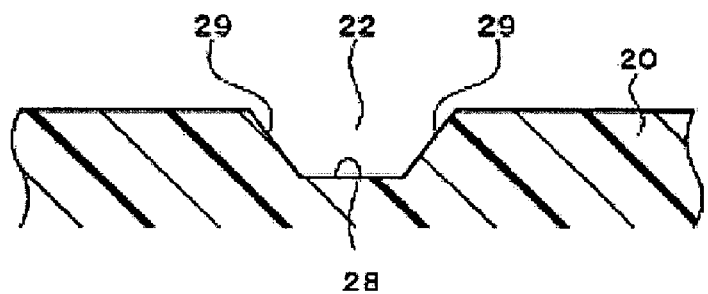
Figure 3:
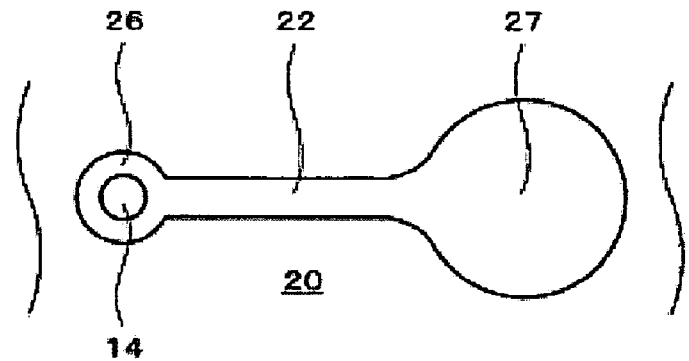
Figure 4:
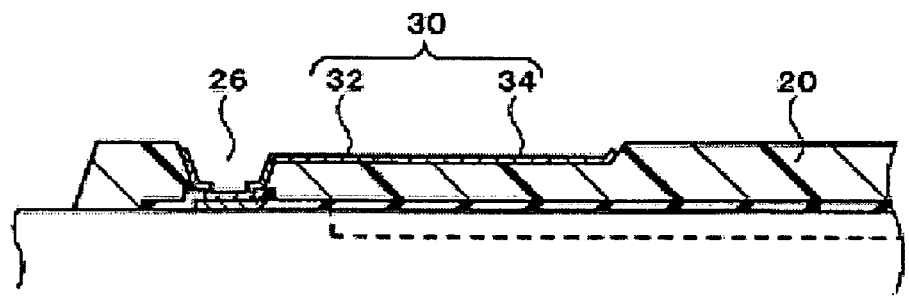
FIGS. 4A through 4D are diagrams to explain the semiconductor device manufacturing method according to the first embodiment applying the invention.
Figure 4:
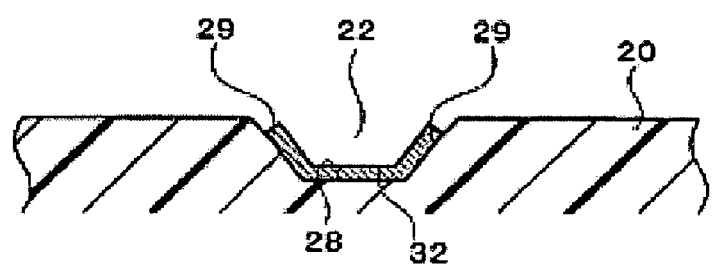
Figure 4:
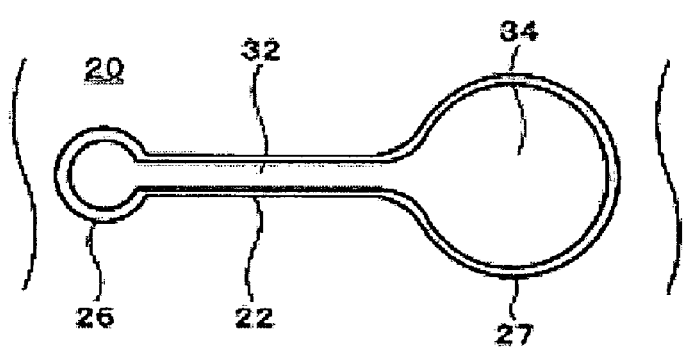
Figure 4:
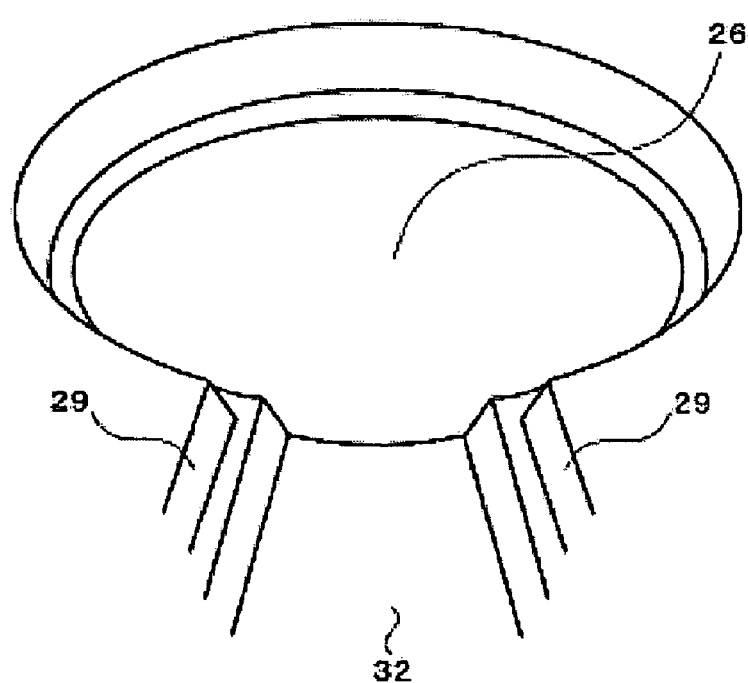
Figure 5:
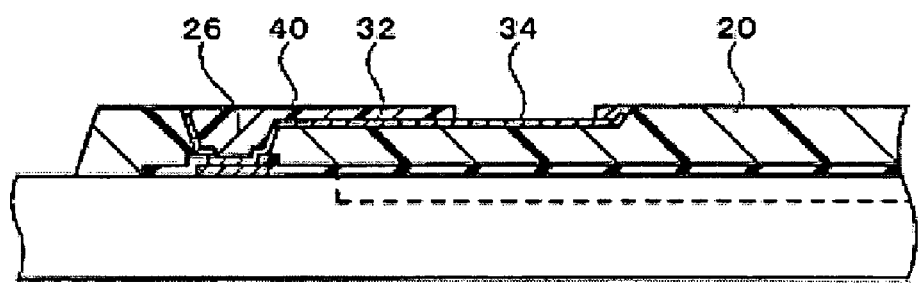
FIGS. 5A through 5C are diagrams to explain the semiconductor device manufacturing method according to the first embodiment applying the invention.
Figure 5:
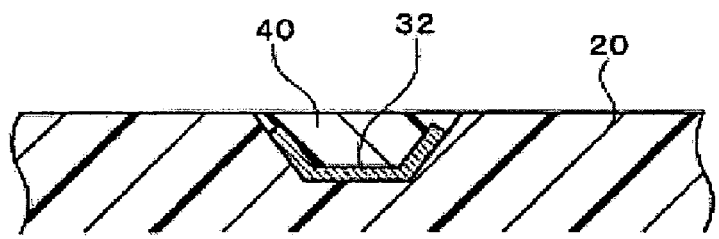
Figure 5:
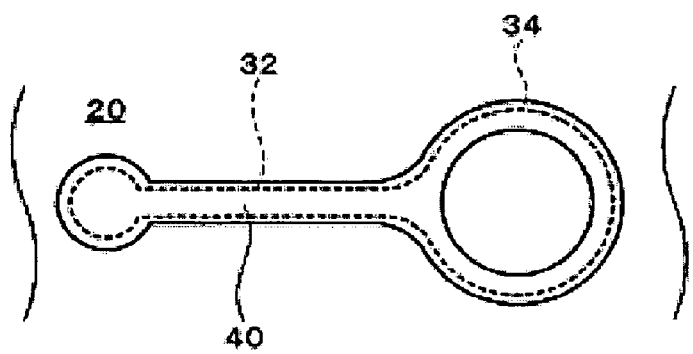
Figure 6:
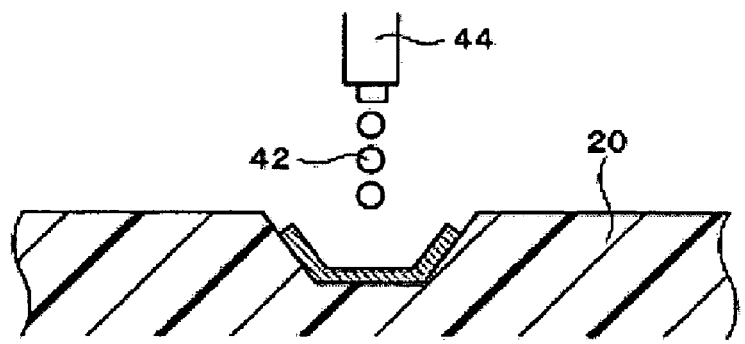
FIGS. 6A and 6B are diagrams to explain the semiconductor device manufacturing method according to the first embodiment applying the invention.
Figure 6:
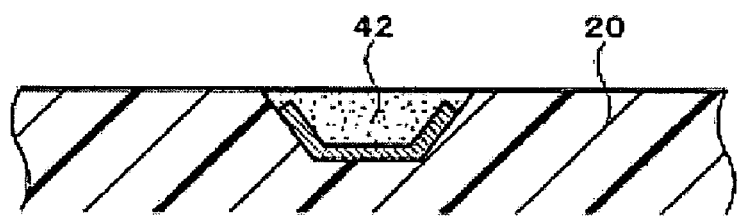

The semiconductor device manufacturing method according to the embodiment includes forming an insulation layer 20 on the semiconductor substrate 10 (see FIGS. 3A through 3C). The insulation layer 20 is formed so as to include a groove 22 on its surface, opposite from the other surface facing the semiconductor substrate 10. If the surface of the insulation layer 20 facing the semiconductor substrate 10 is the first surface, and the surface opposite from the first surface is the second surface, it can be said that the groove 22 is formed on the second surface. The formation of the insulation layer 20 will be described below with reference to FIGS. 2A through 3C, although the method for forming the insulation layer 20 is not limited to a particular method.

As shown in FIG. 2A, the method for forming the insulation layer 20 may include disposing a material 24 of the insulation layer 20 on the semiconductor substrate 10. The insulation layer 20 may be made of resin, and, in this case, the material 24 may be a precursor of resin. The material 24 may be disposed on the entire surface of the semiconductor substrate 10 in a uniform thickness. The material 24 may be formed over the electrodes 14. Further, the method for forming the insulation layer 20 may include forming a recessed part 25 in the material 24. The formation of the recessed part 25 in the material 24 may include, as shown in FIG. 2B, arranging a mask 100 above the material 24 and irradiating the mask with energy. In this case, the mask 100 may have such a structure that partially blocks the energy. For the material 24, a material having a nature that becomes more soluble to a developer when irradiated with energy (namely, a positive-type material) may be used. If the positive-type material is used, the energy may be blocked by the mask 100 on a region where the groove 22 is formed. Then, as shown FIG. 2C, the region irradiated with energy in the developing process is removed so that the recessed part 25 is formed in the material 24. Additionally, the formation of the insulation layer 20 may further include pattering the material 24. The patterning of the material 24 may include, as shown in FIG. 2D, arranging a mask 200 above the material 24 and irradiating the mask with energy. Then, the region irradiated with energy may be removed by a developing process, and the material 24 may be patterned as shown in FIG. 2E. In this process, a through hole 26 that allows penetration of the electrode 14 may be formed in the material 24. The through hole 26 may be formed so as to communicate with the recessed part 25 (see FIG. 2E). Further, by this process, the material 24 may be divided into the regions 11 (see FIG. 1A). Furthermore, the process for forming the insulation layer 20 may include curing (polymerizing) the material 24.

By the above processes, the insulation layer 20 shown in FIGS. 3A through 3C may also be formed. In these processes, the insulation layer 20 is formed so as to have the same shape as that of the patterned material 24. As shown in FIG. 3A, the insulation layer 20 includes the groove 22 formed on its second surface opposite from its first surface facing the semiconductor substrate 10. As shown in FIG. 3B, the groove 22 may be composed of a bottom surface 28 and a side surface 29. That is, a region surrounded by the bottom and side surfaces 28 and 29 may be called the groove 22. Although the cross-sectional configuration of the groove 22 is not limited to a particular cross-sectional configuration, it may be such that the width of the groove 22 becomes narrower as it approaches the semiconductor substrate 10 as shown in FIG. 3B. By using the positive-type material for the material 24, the groove 22 can be formed to have such a configuration. As shown in FIGS. 3A and 3C, the insulation layer 20 may be formed so as to have a recessed part 27 communicating with the groove 22. Further, as shown in FIGS. 3A and 3C, the insulation layer 20 may be formed so as to include the through hole 26. In this case, the through hole 26 may be a hole that exposes the electrode 14. Further, the groove 22 may be communicating with the through hole 26. Additionally, the material for the insulation layer 20 is not limited to a particular material. The insulation layer 20 may be made, for example, of polyimide resin, silicone-modified polyimide resin, epoxy resin, silicone-modified epoxy resin, benzocyclobutene (BCB), or polybenzoxazole (PBO). FIG. 3B is a cross-sectional diagram of the insulation layer 20 as sliced with a plane perpendicular to the groove 22. Further, FIG. 3C is a diagram of the insulation layer 20 viewed from above.

The semiconductor device manufacturing method of the embodiment includes formation of a conductive part 30 on the insulation layer 20 as shown in FIGS. 4A through 4D. The conductive part 30 may be formed so as to be electrically connected to the electrode 14. For example, by using an exposed part at the through hole 26 of the conductive part 30, the conductive part 30 may be electrically connected to the electrode 14. The conductive part 30 includes a wiring part 32 formed in a manner that the wiring part 32 comes in contact with the bottom and side surfaces 28 and 29 of the groove 22 (see FIG. 4B). As shown in FIGS. 4A through 4D, the wiring part 32 may be formed only inside the groove 22, avoiding the surface of the insulation layer 20. As shown in FIG. 4C, the wiring part 32 may extend along the groove 22. Although the cross-sectional shape of the wiring part 32 is not limited to any particular cross-sectional shape, it may be such that is formed along the bottom and side surfaces 28 and 29 of the groove 22 as shown in FIG. 4B. In other words, the wiring part 32 may be formed in a uniform thickness. Further, as shown in FIGS. 4A and 4C, the conductive part 30 may be formed so as to include an electrical connection part 34 that is electrically connected to the wiring part 32. As shown in FIG. 4C, the electrical connection part 34 may have a wider width than that of the wiring part 32. The electrical connection part 34 may be called a land. As shown in FIG. 4C, the electrical connection part 34 may be formed inside the recessed part 27. The electrical connection part 34 may be formed so as to have (almost) the same shape as the external shape of the recessed part 27. That is, the electrical connection part 34 may be formed so as to have a wider width than that of the wiring part 32. The electrical connection part 34 may be formed only inside the recessed part 27. That is, the electrical connection part 34 may be formed avoiding the surface (the second surface) of the insulation layer 20. Further, the conductive part 30 may be formed avoiding the surface (the second surface) of the insulation layer 20 (see FIGS. 4A and 4D).

The method for manufacturing the conductive part 30 is not limited to any particular method, and any known method may apply. In the following, the formation of the conductive part 30 will be described. The formation of the conductive part 30 may include forming the conductive layer on the insulation layer 20 (on the surface, the groove 22, and the through hole 26 of the insulation layer 20). The conductive layer may be a seed layer for carrying out plating. The conductive layer may be formed by sputtering, for example. The conductive layer may be formed on the bottom and side surfaces 28 and 29 of the groove 22. When the groove 22 has a width that becomes narrower towards the semiconductor substrate 10 (see FIG. 3B), the conductive layer can be readily formed on the side surface 29 by sputtering. The conductive layer may be formed on the inner wall of the recessed part 27 (the bottom and side surfaces). Further, the conductive layer may be formed on the inner wall of the through hole 26. The formation of the conductive part 30 may include forming a resist layer on the conductive layer. The resist layer may be patterned. That is, an aperture may be made on the resist layer to partially expose the conductive layer. In this case, the resist layer may be formed so that the region for forming the conductive part 30 in the conductive layer is exposed at the aperture. Further, the resist layer may be formed covering the upper rim of the side surface 29 of the groove 22. As a consequence, the wiring part 32 can be formed only inside the groove 22. The process for forming the conductive part 30 may include depositing metal in the aperture of the resist layer by plating. For the plating process, either electrolytic plating or electroless plating may be employed. Then, the resist layer and the conductive layer may be removed so as to form the conductive part as shown in FIGS. 4A through 4D.

The semiconductor device manufacturing method according to the embodiment may include forming an insulation film 40 over the wiring part 32 as shown in FIGS. 5A through 5C. The insulation film 40 may be formed along the groove 22 (see FIGS. 5A and 5C). The insulation film 40 may be formed so as to fill the groove 22 as shown in FIG. 5B. In this case, the insulation film 40 may be formed so that the surface thereof shares the same surface (the second surface) with the insulation layer 20. The insulation film 40 may be formed so as to fill the through hole 26 of the insulation layer 20 as shown in FIG. 5A. Alternatively, the insulation film 40 may be formed avoiding the through hole 26 (not shown). Further, alternatively, the insulation film 40 may be formed covering the periphery of the electrical connection part 34 and avoiding the central part of the same as shown in FIG. 5C. Alternatively, the insulation film 40 may be formed avoiding the electrical connection part 34 but covering only the wiring part 32 (not shown).

The method for forming the insulation film 40 is not limited to a particular method, and any known method may apply. In the following, with reference to FIGS. 6A and 6B, the formation of the insulation film 40 will be described. The formation of the insulation film 40 may include disposing an insulation paste 42 in the insulation layer 20 (the groove 22), covering the wiring part 32. The method for disposing the insulation paste 42 is not limited to a particular method but may employ an inkjet method, for example. That is, as shown in FIG. 6A, the insulation paste 42 may be disposed in the insulation layer 20 (the groove 22) by ejecting the insulation paste 42 from a nozzle 44. By applying techniques that have been put to practical use for inkjet printers, the inkjet method enables fast and economical disposition of the insulation paste 42. When the wiring part 32 is provided inside the groove 22, the insulation paste 42 may be easily disposed over the wiring part 32 (see FIG. 6B). Thus, even when an insulation paste having low viscosity is used, a highly reliable semiconductor device can be manufactured. That is, it becomes possible to use an insulation paste having viscosity suitable for the inkjet method. Therefore, a highly reliable semiconductor device can be efficiently manufactured. Thereafter, by curing the insulation paste 42, the insulation film 40 may be formed as shown in FIGS. 5A through 5C. Additionally, by adjusting the amount of the insulation paste 42 and shrinkage of the insulation paste 42 upon curing, for example, the region for forming the insulation film 40 may be controlled.

Figure 7:
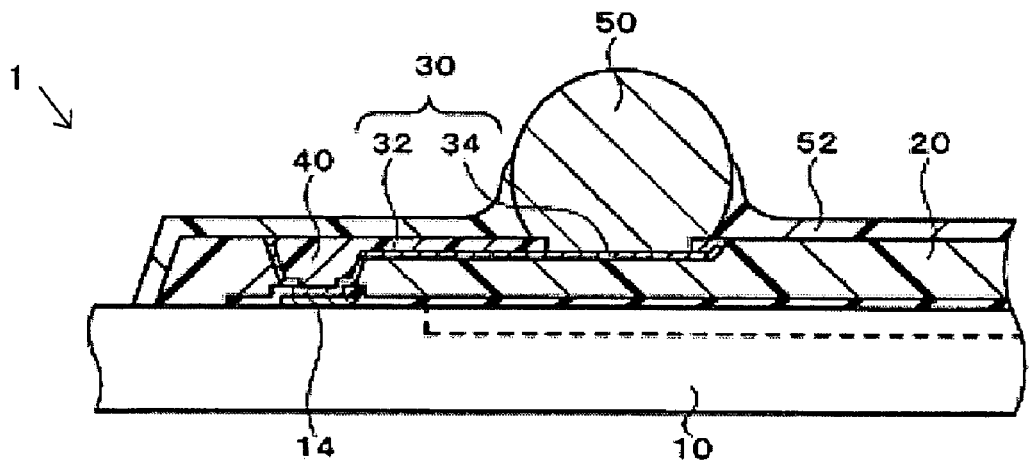
FIG. 7 is a diagram to explain the semiconductor device manufacturing method according to the first embodiment applying the invention.
Figure 8:
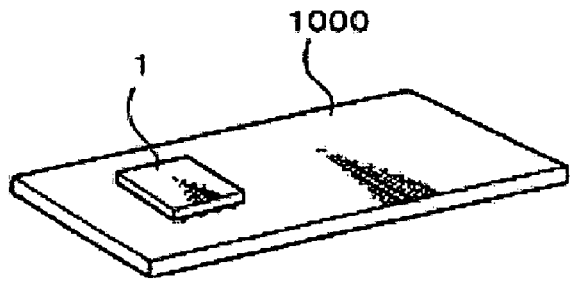
FIG. 8 is a diagram illustrating a circuit substrate, on which the semiconductor device of an embodiment applying the invention is mounted.

The semiconductor device manufacturing method of the embodiment may include forming an external terminal 50. The external terminal 50 may be formed on the electrical connection part 34. That is, the external terminal 50 may be electrically connected at the electrical connection part 34 to the conductive part 30, extended from the insulation film 40 via the exposed part. Also, in this process, a region for mounting the external terminal 50 may be controlled by the insulation film 40. Accordingly, without using a so-called solder resist, the external terminal 50 can be formed. As a consequence, the semiconductor device can be efficiently manufactured. Further, through a process for forming a root reinforcement layer 52 and a detection process, a semiconductor device 1 as shown in FIG. 7 may be manufactured. Additionally, the semiconductor device 1 may be called as such when in a state of a semiconductor wafer or when in a state of a semiconductor wafer that is divided into the regions 11. Further, FIG. 8 shows a circuit substrate 1000 the mounts thereon the semiconductor device 1 divided into chips.

The semiconductor device 1 contains the semiconductor substrate 10. The semiconductor device 1 contains the insulation layer 20 disposed on the semiconductor substrate 10. The insulation layer 20 has the groove 22 formed on its surface, opposite from the other surface facing the semiconductor substrate 10. If the surface of the insulation layer 20 facing the semiconductor substrate 10 is called the first surface, and the surface opposite from the first surface is called the second surface, it can be said that the groove 22 is formed on the second surface. The semiconductor substrate 1 contains the conductive part 30 disposed on the insulation layer 20. The conductive part 30 contains the wiring part 32 formed in such a manner that the wiring part 32 comes in contact with the bottom and side surfaces 28 and 29 of the groove 22. Having such a structure, the contact area between the wiring part 32 and the insulation layer 20 can be widened. As a consequence, the adhesiveness between the wiring part 32 and the insulation layer 20 can increase. This means that the wiring part 32 (the conductive part 30) and the insulation layer 20 may not easily peel off from each other. Hence, even when the wiring part 32 (the conductive part 30) is miniaturized, the peeling off of the wiring part 32 (the conductive part 30) does not readily occur, and a highly reliable semiconductor device can be provided. The wiring part 32 may be formed only inside the groove 22, avoiding the surface of the insulation layer 20. By doing so, stress does not readily concentrate on the wiring part 32, and, thus, a more highly reliable semiconductor device can be provided. Further, the conductive part 30 may contain the electrical connection part 34. The electrical connection part 34 may be formed inside the recessed part 27. Accordingly, the conductive part 30 can be made even more difficult to peel off. Thus, an even more reliable semiconductor device can be provided. Additionally, the whole conductive part 30 can be formed avoiding the surface of the insulation layer 20. Furthermore, the semiconductor device 1 may further contain the insulation film 40 that is formed along the groove 22 and over the wiring part 32. Consequently, exposure of the wiring part 32 as well as the peeling off of the wiring part 32 can be prevented. The insulation film 40 may be arranged only inside the groove 22. In other words, the insulation film 40 may be formed so as not to bulge out from the surface of the insulation layer 20. For example, the insulation film 40 may be formed so that the surface thereof comes to share the same surface with the insulation layer 20. By doing so, it becomes possible to prevent the insulation film 40 from receiving the concentrated stress (for example, the stress occurring between the insulation layer 40 and the root reinforcement layer 52). As a result, a highly reliable semiconductor device can be provided.

Figure 9:
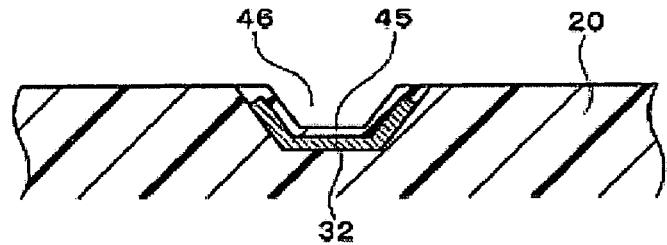
FIG. 9 is a diagram to explain the semiconductor device manufacturing method according a modified example of the first embodiment applying the invention.

It is to be noted that the semiconductor device 1 is not limited to the described structure. For example, the semiconductor device may contain an insulation film 45 as shown in FIG. 9. The insulation film 45 may have a shape in compliance with the shape of the inside (the bottom and side surfaces 28 and 29) of the groove 22. In other words, the insulation film 45 may be formed so as to include a groove 46. Further, the insulation film 45 may be formed in a uniform thickness.

Figure 10:
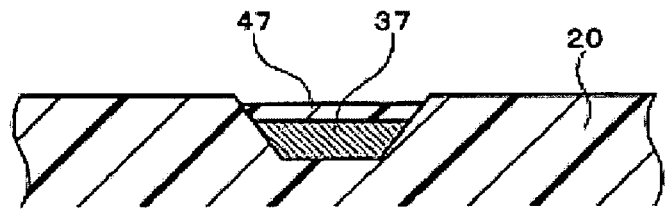
FIG. 10 is a diagram to explain the semiconductor device manufacturing method according a modified example of the first embodiment applying the invention.

In addition, the semiconductor device may contain a wiring part 37 as shown in FIG. 10. The upper surface of the wiring part 37 may be flat. The wiring part 37 may be formed using, for example, a solvent containing semiconductor particles. This solvent may contain conductive microparticles and a dispersant. In this case, the conductive microparticles may be uniformly diffused in the dispersant. The wiring part 37 may be formed via processes such as disposing the solvent into the groove 22 and volatilizing the dispersant thereafter, and dissolving an agent coating the conductive microparticles. The method for disposing the solvent is not limited to a particular method but may be the inkjet method, for example. Because the insulation layer 20 has the groove 22 for the solvent to flow into, it is possible to dispose the solvent as designed even when the solvent has a low viscosity. It is thus possible to choose a solvent suitable for the inkjet method, and the wiring part 37 can be formed efficiently. Additionally, the semiconductor device may further contain an insulation film 47 as shown in FIG. 10. The insulation film 47 may be formed inside the groove 22.

Figure 11:
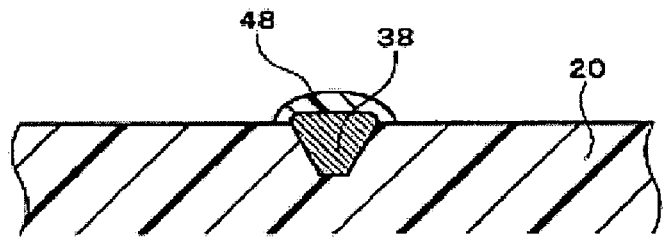
FIG. 11 is a diagram to explain the semiconductor device manufacturing method according a modified example of the first embodiment applying the invention.
Figure 12:
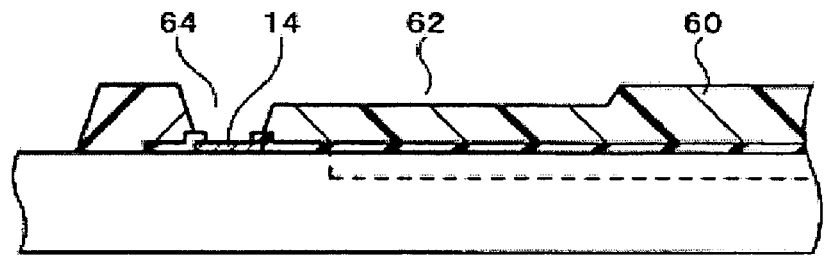
FIGS. 12A and 12B are diagrams to explain the semiconductor device manufacturing method according to a second embodiment applying the invention.
Figure 12:
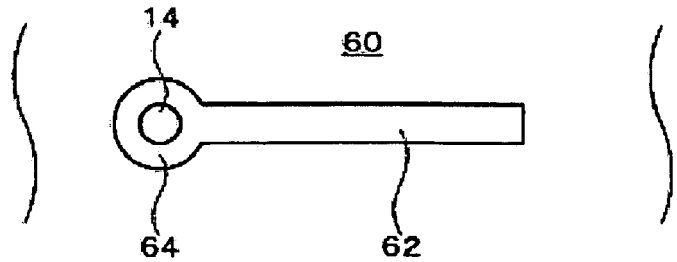
Figure 13:
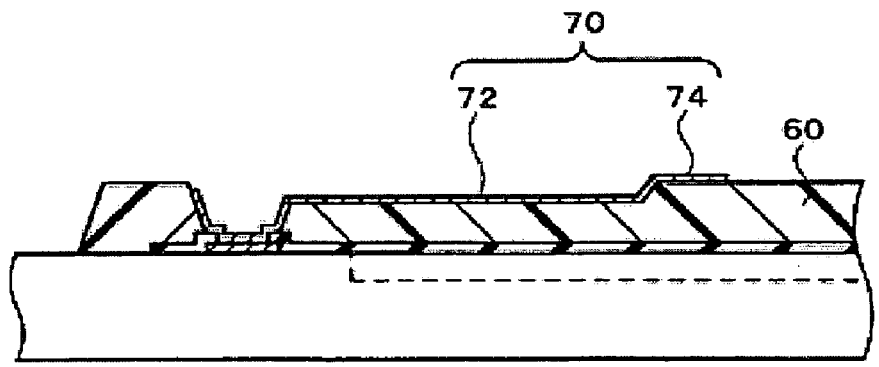
FIGS. 13A and 13B are diagrams to explain the semiconductor device manufacturing method according to the second embodiment applying the invention.
Figure 13:
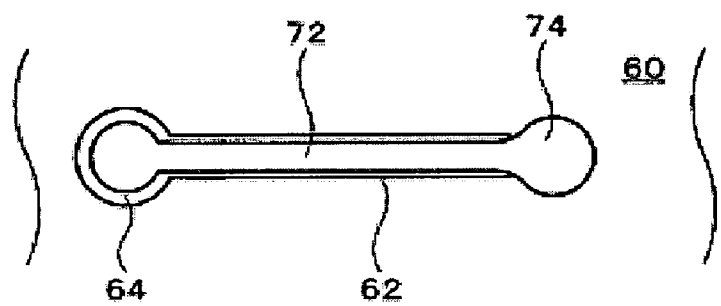

Alternatively, the semiconductor device may contain a wiring part 38 as shown in FIG. 11. A part of the wiring part 38 may be bulging out from the groove 22. In other words, the wiring part 38 may be bulging out from the surface of the insulation layer 20. As described hereinabove, the wiring part 38 is formed so as to come into contact with the bottom and side surfaces of the groove 22. Therefore, even when the wiring part 38 has the part bulged out from the surface of the insulation layer 20, it is possible to prevent the wiring part 38 from peeling off from the insulation layer 20. In this case, the semiconductor device may contain an insulation film 48. The insulation film 48 may be formed on the insulation layer 20. That is, the insulation film 48 may be formed so as to bulge out on the insulation layer 20.

Second Embodiment

Now, the semiconductor device manufacturing method according to the second embodiment applying the invention will be described. FIGS. 12A through 17 are diagrams to explain the semiconductor device manufacturing method of the second embodiment applying the invention.

The semiconductor device manufacturing method of the present embodiment includes forming an insulation layer 60 on the semiconductor substrate 10 as shown in FIGS. 12A and 12B. The insulation layer 60 is formed so as to include a groove 62. The groove 62 is formed on the surface of the insulation layer 60, opposite from the surface facing the semiconductor substrate 10. A through hole 64 that exposes the electrode 14 may be formed in the insulation layer 60. The groove 62 may be communicating with the through hole 64. FIG. 12B is a diagram of the insulation layer 60 viewed from above.

The semiconductor device manufacturing method of the embodiment includes forming a conductive part 70 on the insulation layer 60 as shown in FIGS. 13A and 13B. The conductive part 70 contains a wiring part 72 that is formed so as to come in contact with the bottom and side surfaces of the groove 62. The conductive part 70 may contain an electrical connection part 74 electrically connected to the wiring part 72. The electrical connection part 74 may be formed avoiding the groove 62. That is, the electrical connection part 74 may be formed on the surface of the insulation layer 60. In other words, the electrical connection part 74 may be formed on the second surface of the insulation layer 60.

Figure 14:
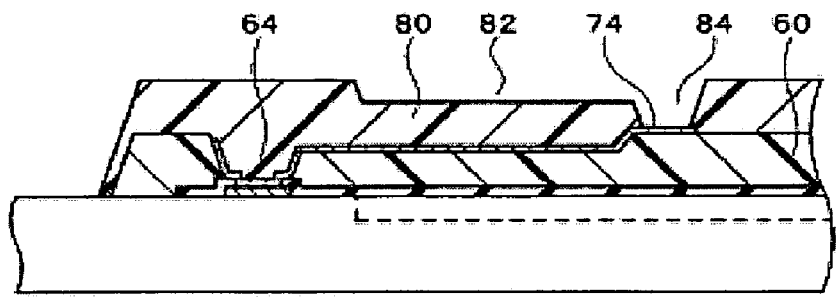
FIG. 14 is a diagram to explain the semiconductor device manufacturing method according to the second embodiment applying the invention.

The semiconductor device manufacturing method of the embodiment includes forming a second insulation layer 80 on the insulation layer 60 as shown in FIG. 14. The second insulation layer 80 may be formed so as to contain a second groove 82, which is formed on a second surface of the second insulation layer 80, opposite from a first surface facing the insulation layer 60. Further, the second insulation layer 80 may be formed so as to contain a through hole 84 that exposes the electrical connection part 74. Then, the second insulation layer 80 may be formed so as to fill the through hole 64.

Figure 15:
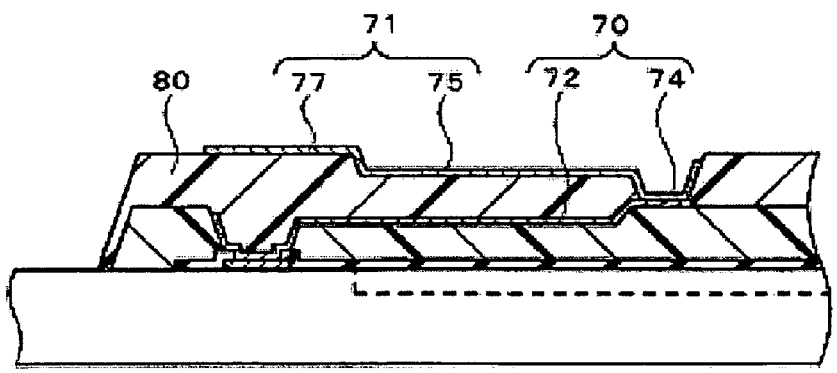
FIG. 15 is a diagram to explain the semiconductor device manufacturing method according to the second embodiment applying the invention.

The semiconductor device manufacturing method of the embodiment includes forming a second conductive part 71 on the second insulation layer 80 as shown in FIG. 15. The second conductive part 71 may be electrically connected to the conductive part 70. The second conductive part 71 is formed so as to contain a second wiring part 75. The second conductive part 71 is formed so that the second wiring part 75 comes in contact with the bottom and side surfaces of the second groove 82. The second conductive part 71 may be formed so as to contain a second electrical connection part 77. The second electrical connection part 77 may be formed on the surface (the second surface) of the second insulation layer 80. Alternatively, the second electrical connection part 77 may be formed inside the recessed part that is formed on the second insulation layer 80 (not shown).

Figure 16:
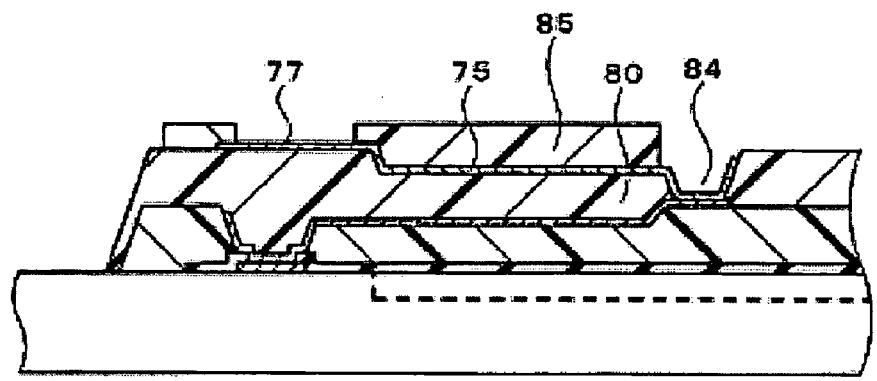
FIG. 16 is a diagram to explain the semiconductor device manufacturing method according to the second embodiment applying the invention.

The semiconductor device manufacturing method of the embodiment includes forming a second insulation layer 85 as shown in FIG. 16. The second insulation film 85 may be formed over the second wiring part 75. Further, the second insulation film 85 may be formed covering part of the second electrical connection part 77. Alternatively, the second insulation film 85 may be formed avoiding the second electrical connection part 77. Further, the second insulation film 85 may be formed avoiding the through hole 84.

Figure 17:
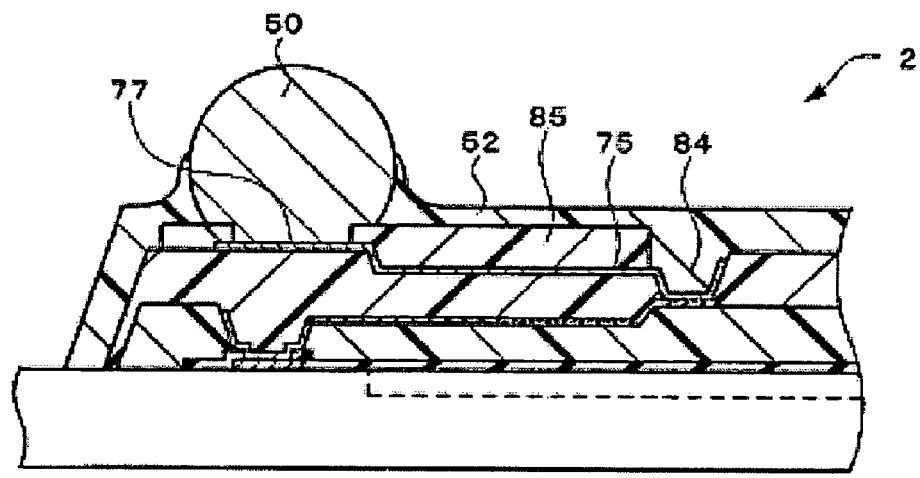
FIG. 17 is a diagram to explain the semiconductor device manufacturing method according to the second embodiment applying the invention.

Then, as shown in FIG. 17, upon carrying out processes such as forming the external terminal 50 and forming the root reinforcement layer 52, a semiconductor device 2 may be manufactured. By these processes, the semiconductor device having a multiple layered insulation part can be efficiently manufactured. Further, by repeating these processes, the semiconductor device having a triple-layered or more than triple-layered insulation part can be manufactured (not shown).

In addition, the invention is not limited to the described embodiments but allows various modifications. For example, the invention includes structures (such as those produced by the same method and giving the same result, or those having the same objectives and effects) that are substantially the same as those described in the embodiments. Further, the invention includes structures in which non-essential elements of the structures described in the embodiments are substituted for other elements. Moreover, the invention includes structures with which the same operational effects can be produced and the same objectives can be achieved as those with the structures described in the embodiments. Furthermore, the invention includes the structures described in the embodiments with additional well-known techniques in the art.

What is claimed is:

1. A semiconductor device, comprising:
    a semiconductor substrate;
    an insulation layer disposed on the semiconductor substrate, the insulation layer including a groove formed therein from a second surface of the insulation layer, the second surface of the insulation layer being opposite from a first surface of the insulation layer facing the semiconductor substrate, a bottom surface of the groove being another surface of the insulation layer disposed between the first surface of the insulation layer and the second surface of the insulation layer;
    a conductive part disposed on the insulation layer, the conductive part including a wiring part extending along the groove, the wiring part having a u-shaped cross-section and being in contact with the bottom surface of the groove and side surfaces of the groove, the wiring part extending along the groove;
    an insulation film formed along the groove and over the wiring part, the insulation film insulating the wiring part from the second surface along the groove; and
    one of a through hole and a recessed part formed from the second surface of the insulation layer at an end of the groove, the one of the through hole and the recessed part communicating with the groove.

2. The semiconductor device according to claim 1, wherein the wiring part is formed only inside the groove.

3. The semiconductor device according to claim 1, wherein the conductive part includes an electrical connection part electrically connected to the wiring part.

4. The semiconductor device according to claim 3, wherein the electrical connection part is formed on the second surface of the insulation layer.

5. The semiconductor device according to claim 3, wherein:
    the one of the through hole and the recessed part is a recessed part; and
    the electrical connection part is formed inside the recessed part.

6. The semiconductor device according to claim 3, further comprising an external terminal formed on the electrical connection part.

7. The semiconductor device according to claim 1, further comprising:
a second insulation layer disposed on the insulation layer, the second insulation layer including a second groove formed therein from a first surface of the second insulation layer, the first surface of the second insulation layer being opposite from a second surface of the second insulation layer, the second surface of the second insulation layer facing the insulation layer, a bottom surface of the second groove being another surface of the second insulation layer disposed between the first surface of the second insulation layer and the second surface of the second insulation layer; and a second conductive part disposed on the second insulation layer, the second conductive part including a second wiring part extending along the second groove, the second wiring part being in contact with the bottom surface of the second groove and a side surface of the second groove.

8. The semiconductor device according to claim 1, wherein the one of the through hole and the recessed part is a through hole.

* * * * *